United States Patent [19]

Watanabe et al.

[11] Patent Number: 4,876,438

[45] Date of Patent: Oct. 24, 1989

[54] CONTROL OF THE POWER TO THE HEATER AND THE SPEED OF MOVEMENT OF A CRYSTAL ROD BY CONTROL OF THE CRYSTAL ROD DIAMETER

[75] Inventors: Masataka Watanabe, Nakakubiki; Nobuhiro Ohhara; Kenichi Taguchi, both of Joetsu, all of Japan

[73] Assignee: Shin-Etu Handotai Co., Ltd., Tokyo, Japan

[21] Appl. No.: 203,441

[22] Filed: Jun. 3, 1988

[30] Foreign Application Priority Data

Jun. 5, 1987 [JP] Japan ................................. 62-141019

[51] Int. Cl.⁴ ............................................. H05B 1/02
[52] U.S. Cl. .................................... 219/497; 219/494; 219/508; 373/139; 29/DIG. 17; 156/DIG. 88
[58] Field of Search ................ 219/490, 491, 494, 497, 219/499, 501, 507–509, 309, 330, 331; 29/DIG. 17; 156/DIG. 84, DIG. 88; 373/17, 139; 307/117

[56] References Cited

U.S. PATENT DOCUMENTS

| | | | |
|---|---|---|---|
| 2,992,311 | 7/1961 | Keller | 156/DIG. 84 |
| 3,243,509 | 3/1966 | Stut | 156/DIG. 88 |
| 3,532,855 | 10/1970 | Van Cleave | 219/497 |
| 3,553,428 | 1/1971 | McGhee | 219/501 |
| 3,986,269 | 10/1976 | Hancock | 219/497 |
| 4,223,207 | 9/1980 | Chow | 219/497 |
| 4,337,388 | 6/1982 | July | 219/309 |
| 4,362,924 | 12/1982 | Story et al. | 219/497 |

FOREIGN PATENT DOCUMENTS

| | | |
|---|---|---|
| 2659194 | 7/1977 | Denmark . |
| 0134680 | 7/1984 | European Pat. Off. . |
| 0142415 | 10/1984 | European Pat. Off. . |
| 1405447 | 10/1971 | United Kingdom . |
| 1561112 | 2/1980 | United Kingdom . |
| 2050650 | 6/1980 | United Kingdom . |

*Primary Examiner*—M. H. Paschall
*Attorney, Agent, or Firm*—Browdy and Neimark

[57] ABSTRACT

An apparatus for use in a crystal manufacturing system based on a floating zone method or Czochralski method, adapted to control a quantity relating to the diameter of a crystal rod at the crystallization boundary, and designed to reduce hunting in the control of the quantity relating to the crystal diameter so as to prevent disturbance in crystallization and reduce irregularities in the surface of the crystal rod even if there is a discrepancy between a predetermined pattern and the ideal pattern with respect to the quantity to be controlled. The apparatus has a controller provided with: a program setter (72) adapted to output a quantity based on a predetermined pattern written in the controller in response to a detected value of the quantity relating to the crystal diameter at the crystallization boundary (24) or to the length of the crystal rod (18); a first adjuster (84) for performing a PI or PID control action in response to the difference between the detected value and the desired value of the quantity relating to the crystal diameter at the crystallization boundary (24); a second adjuster (76) for performing, in response to the difference between the detected value and the desired value of the quantity relating to the crystal diameter at the crystallization boundary (24), $I^2$ control action for additional time-integration of a value obtained by time-integration of this difference; and a superposer (78) for outputting, as an adjustment amount, a value of linear combination between the program setter (72), the first adjuster (84), and the second adjuster (76).

30 Claims, 4 Drawing Sheets

CONTROL OF THE POWER TO THE HEATER AND THE SPEED OF MOVEMENT OF A CRYSTAL ROD BY CONTROL OF THE CRYSTAL ROD DIAMETER

BACKGROUND OF THE INVENTION

1. Field of the Invention

This invention relates to an apparatus for use in a crystal manufacturing system based on a FZ (floating zone) method or CZ (Czochralski) method, the apparatus being adapted to control a quantity relating to the diameter of a crystal rod.

2. Description of the Prior Art

In the process of manufacturing a silicon semiconductor monocrystal, it is desired to minimize the length of conical portion, the first part of crystallization, which is not utilized as a product. However, as the length of this portion is reduced, crystallization is increasingly adversely affected into its disturbances due to requirement of steep change in the diameter. To prevent the occurrence of such disturbance, it is necessary to reduce the hunting to a level low enough during the operation of controlling the crystal diameter This consideration should also apply for elimination of surface irregularities of a main straight body portion of the crystal on comparatively a little softer level.

In a conventional method, therefore, a pattern (empirically determined) for supplying power to a heating device is previously written in a program setter, and the degree of deviation of the predetermined pattern from an ideal pattern (power supply pattern most suitable for obtaining a desired crystal diameter pattern) is minimized by a PI (proportion and integration) control or PID (proportion, integration and differentiation) control such that gains in the PI or PID control become smaller, that is, the proportional gain is reduced so as to lengthen the integration time while reducing the differentiation time, thereby limiting the amplitude of hunting.

In the FZ method, however, the discrepancy between the predetermined pattern and the ideal pattern becomes large so that the gains in the PID control are necessarily increased, because of different heating characteristics of various monocrystal manufacturing device of the kind and of those of even a single device due to a change with time or upon replacement of an induction heating coil. The above discrepancy further more, can be accelerated depending upon the chosen diameter of a polycrystalline rod, the manner in which the diameter of the conical portion changes or the varied length of a floating zone, from batch to batch of floating zone operation. There is therefore a great difficulty in reducing the hunting amplitude to a level satisfactorily low.

In the CZ method also, the discrepancy between the predetermined pattern and the ideal pattern becomes large so that the gains in the PID control are necessarily increased, because of different heating characteristics of various monocrystal manufacturing devices of its kind and of those of even a single device due to a change with time upon replacement of a resistance heater or crucible, or because the amount of silicon melt in the crucible decreases as the crystal grows Thus, there is a limitation on reduction in the amplitude of hunting in this case either.

Such problems are not limited to the case of silicon monocrystallization but it is common for them to exist with any monocrystal crystallizing technique based on the CZ or FZ method.

SUMMARY OF THE INVENTION

In view of these problems, it is an object of the present invention to provide an apparatus for controlling the crystal diameter, the apparatus being capable of reducing hunting in the control of a quantity relating to the crystal diameter so as to prevent disturbance in cystallization and reduce geometrical irregularities in the surface of the grown crystal rod even if there is a fairly large difference between the predetermined pattern and the ideal pattern with respect to the quantity to be controlled.

To this end, the present invention provides an apparatus for controlling the crystal diameter of a crystal rod which operates an controller in the process of growing a monocrystal rod from a melt on the basis of the FZ or CZ method and the controller controls the power supplied to a heating device for the melt, or the speed of movement of the crystal rod relative to the heating device so that a detected value of the quantity relating to the crystal diameter at the crystallization boundary becomes equal to a desired value, the controller having:

a program setting means to output a quantity based on a predetermined pattern written in the controller in response to a detected value of the quantity relating to the diameter of the crystal rod at the crystallization boundary or to the length thereof;

a first adjustment means for performing a PI or PID control action in response to the difference between the detected value and the desired value of the quantity relating to the diameter at the crystallization boundary;

a second adjustment means for performing, in response to the difference between the detected value and the desired value of the quantity relating to the crystal diameter at the crystallization interface, $I^2$ control action for further time-integration of a value obtained by time-integration of this difference; and a superposition means for outputting, as an adjustment amount, a value of linear combination between the program setting means, the first adjustment means, and the second adjustment means.

The quantity relating to the crystal diameter at the crystallization boundary may include, for example, the crystal diameter itself and the diameter $D_m$ of a melt shoulder portion specially in the case of the FZ method.

In accordance with the present invention, the first adjustment means performs the PI or PID control action and the second adjustment means performs the $I^2$ control action so that the difference between the pattern of the ideal adjustment amount and the pattern of the predetermined adjustment amount previously written in the program setting means is reduced, thereby reducing gains of the PI or PID control. It is therefore possible to reduce the amplitude of hunting during control and prevent spill-over of the melt while reducing geometrical irregularities in the surface of the crystal rod.

Moreover, the $I^2$ control action enables elimination of the need for changing the pattern of the predetermined adjustment amount even if there is a substantial difference between the predetermined adjustment amount pattern and the ideal adjustment amount pattern due to variations of heating characteristics or the desired diameter of the crystal rod.

BRIEF DESCRIPTION OF THE DRAWINGS

FIGS. 1 to 3 relate to a first embodiment of the present invention;

DESCRIPTION OF THE PREFERRED EMBODIMENTS

Figure 1:
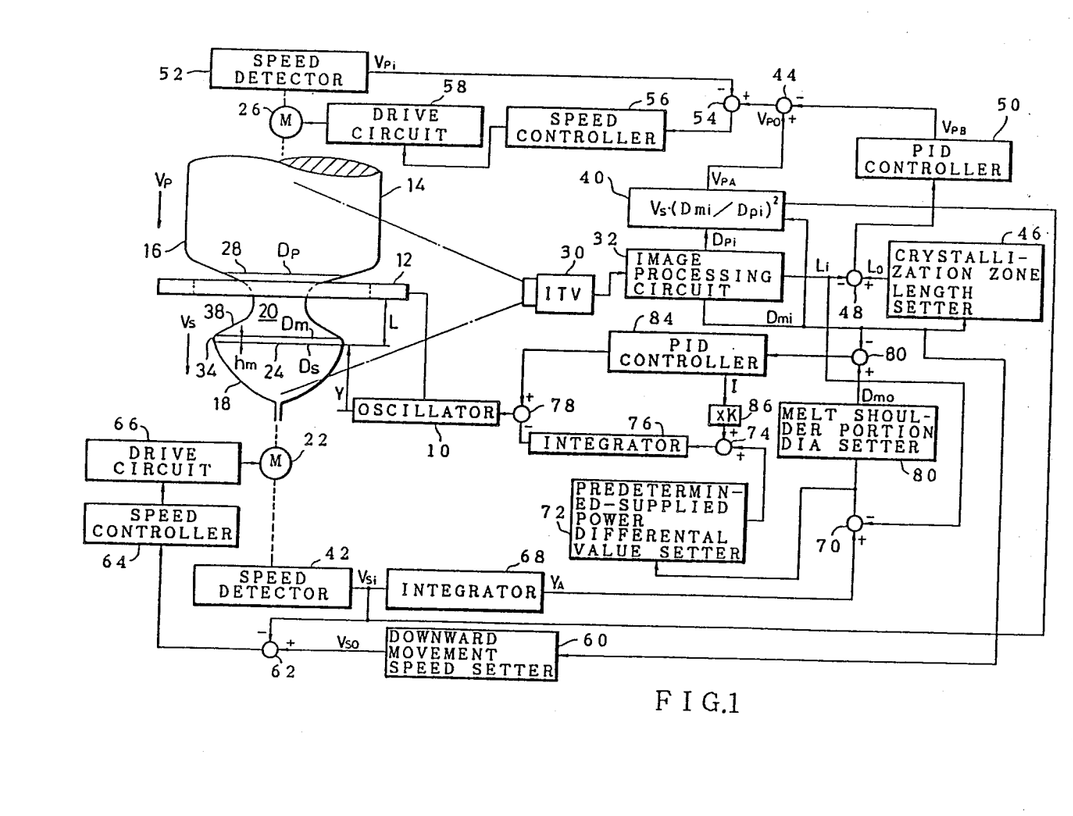
FIG. 1 is a block diagram of an apparatus for controlling the crystal diameter, the apparatus being applied to a system based a FZ method.

Preferred embodiments of the present invention will be described below with reference to the accompanying drawings. FIG. 1 schematically shows the entire construction of an apparatus for controlling the crystal diameter and the crystallization-side zone length.

An oscillator 10 supplies a high-frequency current to an induction heating coil 12 so that a raw-material rod 16 is heated and melted from its lower end toward its upper end, thereby making a monocrystalline rod 18 grow. A floating zone 20 is formed between the raw-material rod 16 and the monocrystalline rod 18.

The monocrystalline rod 18 is vertically disposed and is moved downward at a velocity $V_s$ by an adjustable-speed motor 22 which is adapted to move this rod in the vertical direction. The monocrystalline rod 18 is rotated around its center axis by a motor (not shown) at a constant speed so that the temperature distribution over a portion which includes an interface 24 between the monocrystalline rod 18 and the floating zone 20 is in a rotation symmetry The raw-material rod 16 is also vertically disposed and is moved downward at a velocity $V_P$ by a adjustable-speed motor 26 which is adapted to move the raw-material rod 16 in the vertical direction. The raw-material rod 16 is rotated by a motor (not shown) at a constant speed so that the temperature distribution over a portion which includes an interface 28 between the raw-material rod 16 and the floating zone 20 is in a rotation symmetry The floating zone 20 and a region containing this zone are monitored by a fixed industrial TV camera 30, and a composite image signal output therefrom is supplied to an image processing circuit 32, thereby measuring a diameter $D_P$ at the crystallization interface 28, a crystallization-side zone length L between the lower surface of the induction heating coil 12 and the crystallization interface 24, and a diameter $D_m$ of a crystallization-side melt shoulder portion 34 between a crystallization-side sloping portion 38 of the melt and the crystallization interface 24.

The diameter $D_m$ of the crystallization-side melt shoulder portion 34 is measured at a position above the crystallization interface 24 at a constant distance $h_m$ therefrom. The correlation between the melt shoulder portion diameter $D_m$ and a crystal diameter $D_s$ at the crystallization interface exhibited after a certain period of time is particularly strong (USP Appln. Ser. No. 07/132,191, EP Appln. Ser. No. 87 118 479). Preferably, the distance $h_m$ is 3 to 5 mm.

Each of the melting-interface diameter $D_P$ and the melt shoulder portion diameter $D_m$ is measured as a dimension which is proportional to the length of a portion of a horizontal scanning line with a value of luminance greater than a reference value. Each of the positions of the melting-interface 28, the crystallization interface 24 and the lower surface of the induction heating coil 12 is detected as a position at which the luminance of the scanning lines in the vertical direction abruptly changes. The distance $h_m$ corresponds to the distance between a horizontal scanning line corresponding to the crystallization interface 24 and another horizontal scanning line located above the former with a certain number of other scanning lines interposed therebetween.

[Speed Control for Downward Movement of Raw-Material Rod]

The operation of controlling the speed $V_P$ at which the raw-material rod 16 is moved downward will be described below.

Referring to FIG. 1, an operator 40 for calculating the speed at which the raw-material rod moves downward is supplied with a melting-interface diameter $D_{pi}$ and a melt shoulder portion diameter $D_{mi}$ from the image processing circuit 32, and is also supplied with a downward movement speed $V_{si}$ from a speed detector 42 for detecting the speed at which the monocrystalline rod 18 moves downward The operator 40 calculates $V_s \cdot (D_{mi}/D_{pi})^2$ with values thereby supplied, and supplies a value thereby calculated as a desired downward movement speed $V_{PA}$ to a subtracter 44. The desired downward movement speed $V_{PA}$ is a desired value of the downward movement speed $V_p$ in a case where the volume of the floating zone 20 is constant.

Figure 2:
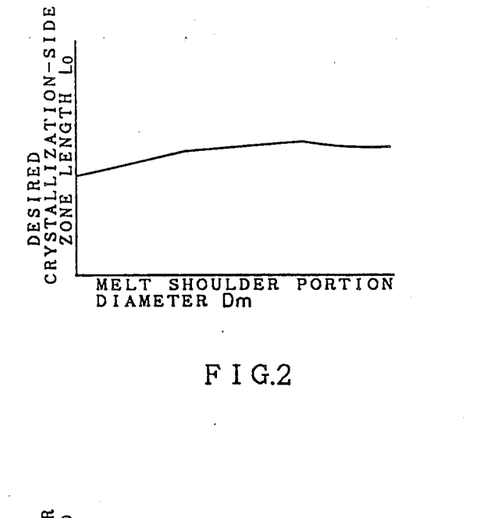
FIG. 2 is a diagram of an input-output characteristic of a crystallization-side zone length setter.

If the volume of the floating zone 20 changes with passage of time, an approximating process is carried out as described below whereby a corrected desired downward movement speed $V_{PB}$ is supplied as a correction value to the subtracter 44. That is, the subtracter 44 is supplied with a detected crystallization zone length $L_i$ and a desired crystallization zone length $L_o$ from the image processing circuit 32 and a crystallization zone length setter 46, respectively. These values are compared with each other, the difference therebetween is amplified and is thereafter supplied to a PID controller 50, and a signal output from the PID controller 50 is supplied as a corrected desired downward movement speed $V_{PB}$ to the subtracter 44. The crystallization zone length setter 46 outputs, in response to the melt shoulder portion diameter $D_{mi}$ from the image processing circuit 32, the desired crystallization zone length $L_o$ that is a function of the melt shoulder portion diameter $D_m$ as shown in FIG. 2. The value of the desired crystallization zone length $L_o$ is constant with respect to a straight body portion but it is not set to be constant with respect to a conical portion. This is because there is an increased possibility of the melt spilling over the conical portion since, with respect to this portion, it is desired to make the melt shoulder portion diameter $D_{mi}$ greater than the diameter $D_{si}$ at the crystallization interface and, therefore, the desired crystallization zone length $L_o$ is increased specifically at such a portion in order to prevent spill-over of the melt specifically or to avoid occurrence of dislocation in the crystal. However, if the crystallization zone length $L_i$ is excessively increased, various problems occur. For instance, the melt portion may break because it is not adequately retained, or the electromagnetic connection between the coil and the melt portion may be deteriorated. Therefore, it is needed to select a suitable value of this length.

The subtracter 44 supplies a differential amplifier 54 with the difference between the desired downward movement speed $V_{PA}$ from the operator 40 and the corrected desired downward movement speed $V_{PB}$ from the PID controller 50 as a desired speed $V_{po}$ of downward movement of the raw-material rod. The differential amplifier 54 compares a speed $V_{pi}$ of downward movement of the raw-material rod 16 detected by a downward movement speed detector 52 with the desired speed $V_{po}$ of downward movement of the raw material rod supplied from the subtracter 44, amplifies the difference between these speeds, and supplies this difference as an operational signal to a speed controller 56. The speed $V_P$ at which the raw-material rod 16 is moved downward by the adjustable-speed motor 26 is thereby controlled through the medium of a drive circuit 58.

[Speed Control for Downward Movement of Monocrystalline Rod]

Next, the operation of controlling the speed $V_s$ at which the monocrystalline rod 18 is moved downward will be described below.

The speed $V_{si}$ which is detected by the speed detector 42 and at which the monocrystalline rod 18 is moved downward and a desired speed $V_{so}$ of downward movement of the raw-material rod supplied from a downward movement speed setter 60 are supplied to a differential amplifier 62, and the difference therebetween is amplified and is thereafter supplied as an operational signal to a speed controller 64. An output from the speed controller 64 is supplied to a drive circuit 6, thereby controlling the speed Vs at which the monocrystalline rod 18 is moved downward by the adjustable-speed motor 22. The downward movement speed setter 60 serves as a program setter and outputs, in response to the melt shoulder portion diameter $D_{mi}$ supplied from the image processing circuit 32, the desired speed $V_{so}$ of the downward movement of the monocrystalline rod which is a function of the melt shoulder portion diameter $D_{mi}$.

[Control Of Monocrystalline Rod Diameter]

Next, the operation of controlling the diameter $D_s$ of the monocrystalline rod will be described below.

Figure 3:
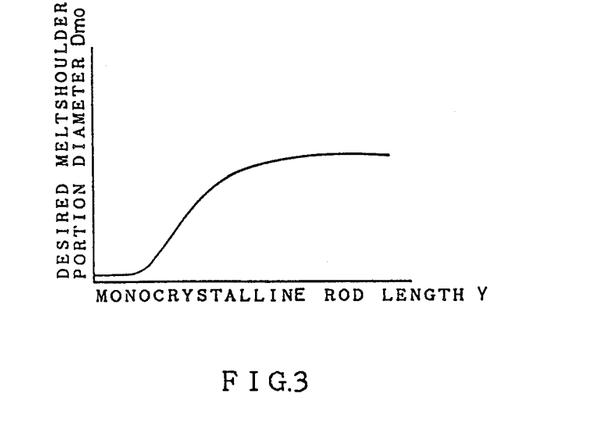
FIG. 3 is a diagram of an input-output characteristics of a melt shoulder portion diameter setter.

The speed $V_{si}$ of downward movement of the monocrystalline rod 18 detected by the downward movement speed detector 42 is integrated by an integrator 68, and is thereafter supplied as an integrated rod length $Y_A$ to a subtracter 70. The integrated rod length $T_A$ represents the length of the monocrystalline rod 18 when $L_i = 0$, and it is corrected by the crystallization-side zone length $L_i$ supplied from the image processing circuit 32. That is, the subtracter 70 supplies a predetermined-supplied-power differential value setter 72 with the difference between the integrated rod length $Y_A$ and the crystallization-side zone length $L_i$ as a monocrystalline rod length Y. The differential value setter 72 serves as a program setter and supplies an adder 74 with a differential value $E_P$ of the predetermined supplied power which is a function of the monocrystalline rod length Y. The differential value $E_P$ is supplied to an integrator 76 via the adder 74, is integrated by this integrator, and is supplied to a power control input terminal of the oscillator 10 via an adder 78, thereby controlling the lower supplied from the oscillator 10 to the induction heating coil 12. The use of the differential value $E_P$ of the predetermined supplied power enables the detected melt shoulder portion diameter $D_{mi}$ to be approximated to the desired melt shoulder portion diameter $D_{mo}$. The monocrystalline rod length Y is also supplied to a melt shoulder portion diameter setter 80 which serves as program setter and which supplies, in response to the value of the monocrystalline rod length Y, a differential amplifier 82 with the desired melt shoulder diameter $D_{mo}$ that is a function of the monocrystalline rod length Y, as shown in FIG. 3. The differential amplifier 82 supplies a PID controller 84 with an operational signal formed from the difference between the desired melt shoulder portion diameter $D_{mo}$ supplied from the melt shoulder portion diameter setter 80 and the detected melt shoulder portion diameter $D_{mi}$ supplied from the image processing circuit 32. An output from the PID controller 84 is supplied to the adder 78, thereby correcting the integrated value of the predetermined-supplied-power differential value $E_P$.

In this case, it is required to reduce gains of the PID control action and limit the amplitude of hunting in order to prevent spill-over of the melt. However, if the gains are reduced, the correction becomes inadequate so long as it is based on the output form the PID controller 84. In this embodiment, to cope with this problem, an I-control-action component output from the PID controller 84 is supplied to and multiplied by a constant multiplier 86, is thereafter supplied to the adder 74, and is integrated together with the predetermined-supplied-power differential value $E_P$ by the integrator 76, thereafter being supplied to the adder 78 to effect correction.

As a result of an experiment of such a correction process, the detected melt shoulder portion diameter $D_{mi}$ could be stably approximated to the desired melt shoulder portion diameter $D_{mo}$ without changing the fundamental pattern written in the predetermined-supplied-power differential value setter 72 even if the induction heating coil 12 was replaced by an alternative heating coil having different characteristics or if the diameter of the raw-material rod 16 had a different diameter. In consequence, the length of the conical portion could be reduced while the melt was prevented from spilling over and, at the same time, the peripheral surface of the monocrystalline rod 18 exhibited very small irregularities.

In accordance with this embodiment, the crystal diameter $D_s$ at the crystallization interface exhibited after a certain period of time can be predicted from the melt shoulder portion diameter $D_m$, and it can therefore be controlled with rapid response while the degree of hunting is minimized.

The described embodiment exemplifies a case in which the melt shoulder portion diameter $D_m$ is used as a quantity relating to the diameter at the crystallization interface, but the present invention is not limited to this and the diameter $D_s$ at the crystallization interface itself may be used instead.

In another possible arrangement, the diameter $D_s$ at the crystallization interface may be controlled by changing the speed $V_P$ of downward movement of the raw-material rod 16 or changing both the speed $V_P$ and the power supplied to the induction heating coil 12 instead of changing only this supplied power.

In addition, the differential value $E_P$ of the predetermined supplied power may be a function of the melt shoulder portion diameter $D_m$ or the crystal diameter $D_s$ at the crystallization interface other than the monocrystalline rod length Y.

Figure 4:
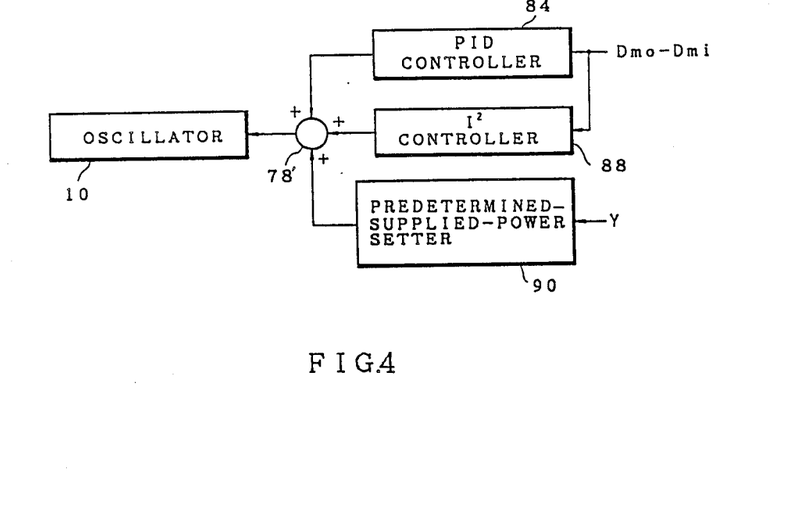
FIG. 4 is a block diagram of a part of a second embodiment of the present invention.

A second embodiment of the present invention will now be described with reference to FIG. 4.

In the second embodiment, the difference ($D_{mo} - D_{mi}$) between the desired value of the detected value of the melt shoulder portion diameter is supplied to the PID controller 84 and an $I^2$ controller 88, and values output from the PID controller 84, the $I^2$ controller 88 and the predetermined-supplied-power setter 90 are supplied to an adder 78' so that they are added to each other. An addition value thereby obtained is supplied to the oscillator 10.

The $I^2$ controller 88 is equivalent to a device constituted by a pair of I controllers connected in series and is adapted to further time-integrate an input value which has already been time-integrated, and output the integrated value.

The predetermined-supplied-power setter 90 serves as a program setter and is adapted to set a value which is time-integrated from a value set by the predetermined-supplied-power differential value setter 72 shown in FIG. 1. Except for these points, the arrangement of the second embodiment is the same as the first embodiment.

The second embodiment is simpler than the first embodiment in terms of construction.

Figure 5:
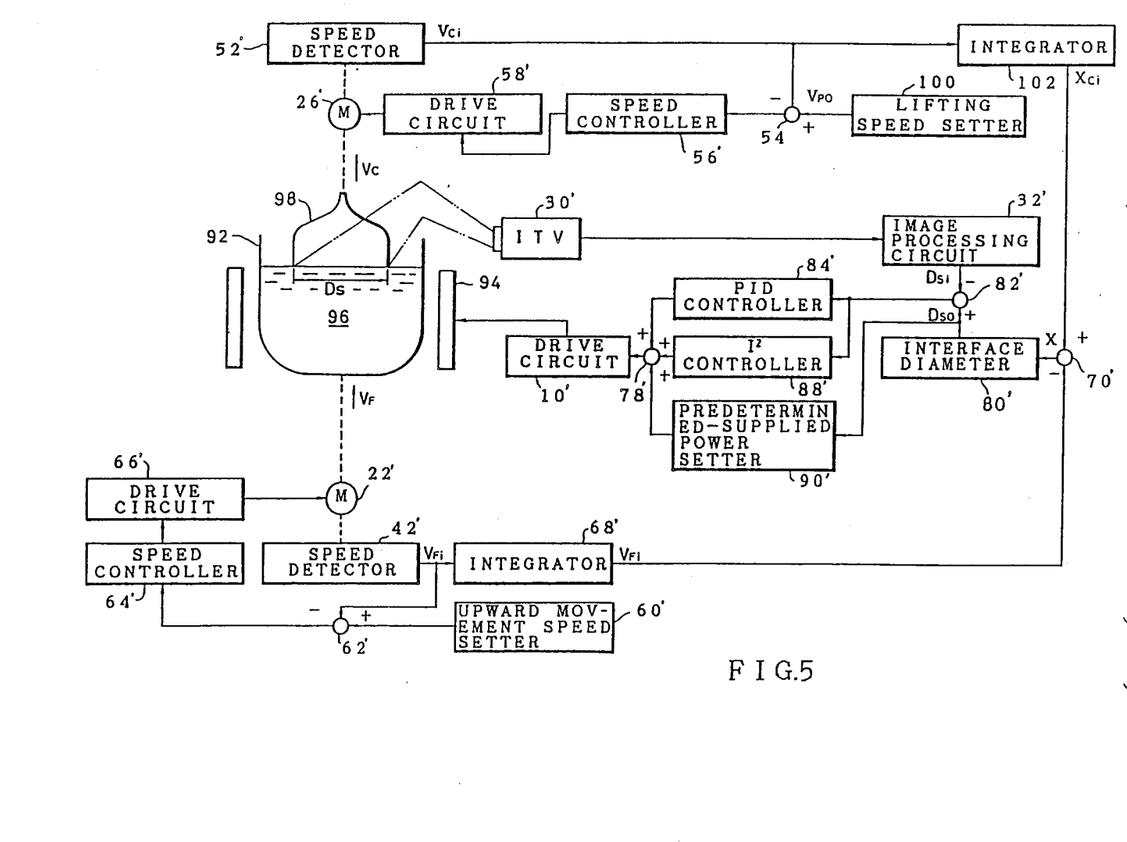
FIG. 5 is a block diagram of an apparatus for controlling the crystal diameter which represents a third embodiment of the present invention applied to a system

Next, a third embodiment of the present invention will be described below. FIG. 5 shows the entire construction of an apparatus adapted to control the crystal diameter at the crystallization interface and adapted for use in a crystal manufacturing system based on the CZ method. Components in this embodiment corresponding to those shown in FIGS. 1 and 2 are indicated by the same reference numerals with primes attached thereto.

A raw material in a crucible 92 is molten by a heater 94 encircling the crucible 92 so as to form a melt 96. A seed crystal is plunged into the melt 96 and is lifted, thereby manufacturing a monocrystalline rod 98. The monocrystalline rod 98 is rotated by a motor (not shown) and is lifted by a motor 22' at a speed $V_c$. As the melt 96 decreases, the crucible 92 is moved upward so as optimize the relationship between the melt 96 and the heater 94 or the temperature distribution in the melt 96.

The interface between the melt 96 and the monocrystalline rod 98 and a portion which includes this interface are monitored by means of a fixed industrial TV camera 30', and a composite image signal output therefrom is supplied to an image processing circuit 32', thereby measuring the crystal diameter $D_s$ at the interface 28

[Speed Control for Upward Movement of Crucible]

A speed $V_F$ at which the crucible is moved upward is controlled by the motor 22', a speed detector 42', an upward movement speed detector 60', a differential amplifier 62', a speed controller 64', and a drive circuit 66', and so forth. The upward movement speed setter 60' serves as a program setter and sets the speed at which the crucible is moved upward and which is a function of the time.

[Control of Monocrystal Rod Lifting Speed]

Similarly, a speed $V_c$ at which the monocrystalline rod 98 is lifted is controlled by the motor 26', a speed detector 52', a lifting speed setter 100, a differential amplifier 54', a speed controller 56', and a drive circuit 58', and so forth. The lifting speed setter 100 serves as a program setter and sets the speed at which the crucible is lifted and which is a function of the time. The lifting speed $V_c$ is constant at the time of manufacture of the straight body portion.

[Control of Crystal Diameter at Crystallization Interface]

Next, the operation of controlling of the crystal diameter $D_s$ at the crystallization interface will be described below.

A lifting speed $V_{Fi}$ of the crucible 92 detected by the speed detector 42' is time-integrated by an integrator 68' and is supplied as a crucible lifting distance $X_{Fi}$ to a subtracter 70'. A lifting speed $V_{Ci}$ of the monocrystalline rod 98 detected by the speed detector 52' is integrated by an integrator 102 and is supplied as a monocrystal lifting distance $X_{Ci}$ to the subtracter 70'. The subtracter 70' supplies the difference between $X_{Ci}$ and $X_{Fi}$ as a monocrystalline rod length X to an interface diameter setter 80' which serves as a program setter and which supplies a differential amplifier 82' with a desired crystal diameter $D_{so}$ at the crystallization interface which is a function of the monocrystal lifting speed $X_{Ci}$. The differential amplifier 82' supplies a PID controller 84' and an $I^2$ controller 88' with an operational signal formed from the difference between the desired diameter $D_{so}$ at the crystallization interface and a detected crystal diameter $D_{si}$ supplied from the image processing circuit 32'. Values output from these controllers and a value output from a predetermined-supplied-power setter 90' are added to each other by an adder 78', as in the case of the second embodiment. The predetermined-supplied-power setter 90' serves as a program setter and is controlled in such a manner that electric power is supplied to a heater 94 via a drive circuit 10' in accordance with a value output from the adder 78' and that the crystal diameter $D_{si}$ at the crystallization interface thereby becomes equal to the desired crystal diameter $D_{so}$. The drive circuit 10' is constituted by a TRIAC or the like.

As a result of an experiment of this control, the detected crystal diameter $D_{si}$ at the crystallization interface could be stably approximated to the desired crystal diameter $D_{so}$ without changing the fundamental pattern written in the predetermined-supplied-power setter 90' even if the properties of the crucible 92 or the heater 94 change with passage of the time or if the crucible 92 or the heater 94 are replaced. In consequence, the length of the conical portion could be reduced while the peripheral surface of the monocrystalline rod 18 exhibited very small irregularities.

[Operation of $I^2$ Controller]

The description will be made with reference to FIG. 4.

To simplify the analysis, the output from the predetermined-supplied-power setter is assumed to be $K_A t$. $K_A$ is a constant and t represents the time. It is also assumed that the action of disturbance upon the object to be controlled is equal to the supply of $-K_B t$ to the adder 78'. $K_B$ is a constant. Such a disturbance corresponds to a case where, when the motor 22' is stopped so as to to fix the crucible 92 in a process based on the CZ method, heating characteristics of the heater 94 relative to the melt 96 change as the monocrystalline rod 98 is lifted, that is, the position of the interface is lowered.

If $f(t) = D_{mo} - D_{mi}$, an output Z from the adder 78' is represented by an expression:

$$Z = K_P f(t) + K_I \int f(t)dt + K_D d/t\, f(t) + K_{II} \int \int f(t)dt\, dt + K_A t - K_B t \qquad (1)$$

where gains $K_P$, $K_I$, $K_D$ and $K_{II}$ are constants.

Since, in the case of crystal diameter control, the proportional control action and the derivative control action are minute when compared with other operations expression 1 is approximated by an expression:

$$Z = K_I \int f(t)dt + K_{II} \int \int f(t)dtdt + K_A t - K_B t \quad (2)$$

If expression 2 is solved with respect to a case where the output Z is stable, $$f(t) = (K_B - K_A)/K_I \cdot EXP\{-(K_{II}/K_I)t\} \quad (3)$$

is obtained.

Therefore, $I^2$ control enables a control deviation to be extinguished by the time constant represented by $K_I/K_{II}$ even if a continuous disturbance occurs.

However, $I^2$ control is not carried out, or if $K_{II} = 0$ in expression 3, $$f(t) = (K_B - K_A)/K_I \quad (4)$$

so that the control deviation is not converged to 0.

As can be understood from the foregoing, it is possible to make the control deviation very small by carrying out $I^2$ control if, in the control process, there is a possibility of occurrence of a large continuous disturbance.

The present invention can be applied to a process of crystallizing a monocrystal of a single element semiconductor such as silicon semiconductor, a monocrystal of a semiconductor formed from a chemical compound such as gallium arsenide, or monocrystals of various types of ceramics. The atmosphere at the time of crystal growth is effective at any pressure, e, g., a reduced or increased pressure as well as the atmospheric pressure.

What is claimed is:

1. A diameter controller for crystallization based on the FZ or CZ method, comprising:
    setting means to output a predetermined value in response to a first detected value of a quantity relating to a crystal grown from a melt;
    first control means for performing one PI control action in response to a difference between a second detected value of a quantity relating to a diameter of said crystal and a desired value of said second detected value;
    second control means for outputting a value proportional to double time-integral of said difference in response to said difference;
    superposition means for outputting a value of representing a linear combination of the output of said setting means, the output of said first control means and the output of said second control means;
    final control means for controlling, in response to the output from said superposition means, power supplied to a heating device for melting a raw material so as to limit said difference towards zero.

2. A diameter controller for crystallization according to claim 1, wherein said second control means comprises two integrators connected in series.

3. A diameter controller for crystallization based on the FZ method according to claim 1, wherein said second detected value relating to said diameter is a diameter of said melt at a position within 5 mm from said crystallization boundary.

4. A diameter controller for crystallization based on the CZ method according to claim 1, wherein said second detected value relating to said diameter is a diameter of said crystal at said crystallization boundary.

5. A diameter controller for crystallization based on the FZ method according to claim 1, wherein said first detected value relating to said crystal is a length of said crystal.

6. A diameter controller for crystallization based on the FZ or CZ method, comprising:
    setting means to output a predetermined value in response to a first detected value of a quantity relating to a crystal grown from a melt;
    first control means for performing one PI control action in response to a difference between a second detected value of a quantity relating to a diameter of said crystal and a desired value of said second detected value;
    second control means for outputting a value proportional to double time-integral of said difference in response to said difference;
    superposition means for outputting a value of representing a linear combination of the output of said setting means, the output of said first control means and the output of said second control means;
    final control means for controlling, in response to the output from said superposition means, speed of movement of said crystal moved axially relative to said heating device so as to limit said difference towards zero.

7. A diameter controller for crystallization according to claim 6, wherein said second control means comprises two integrators connected in series.

8. A diameter controller for crystallization based on the FZ method according to claim 6, wherein said second detected value relating to said diameter is a diameter of said melt at a position within 5 mm from said crystallization boundary.

9. A diameter controller for crystallization based on the CZ method according to claim 6, wherein said second detected value relating to said diameter is a diameter of said crystal at said crystallization boundary.

10. A diameter controller for crystallization based on the FZ method according to claim 6, wherein said first detected value relating to said crystal is a length of said crystal.

11. A diameter controller for crystallization based on the FZ or CZ method, comprising:
    setting means to output a predetermined value in response to a first detected value of a quantity relating to a crystal grown from a melt;
    first control means for performing one PI control action in response to a difference between a second detected value of a quantity relating to a diameter of said crystal and a desired value of said second detected value;
    second control means for outputting a value proportional to double time-integral of said difference in response to said difference;
    superposition means for outputting a value of representing a linear combination of the output of said setting means, the output of said first control means and the output of said second control means;
    final control means for controlling, in response to the output from said superposition means, power supplied to a heating device for melting a raw material and speed of movement of said crystal moved axially relative to said heating device so a to limit said difference towards zero.

12. A diameter controller for crystallization according to claim 11, wherein said second control means comprises two integrators connected in series.

13. A diameter controller for crystallization based on the FZ method according to claim 11, wherein said second detected value relating to said diameter is a diameter of said melt at a position within 5 mm from said crystallization boundary.

14. A diameter controller for crystallization based on the CZ method according to claim 11, wherein said second detected value relating to said diameter is a diameter of said crystal at said crystallization boundary.

15. A diameter controller for crystallization based on the FZ method according to claim 11, wherein said first detected value relating to said crystal is a length of said crystal.

16. A diameter controller for crystallization based on the FZ or CZ method, comprising:
- setting means to output a predetermined value in response to a first detected value of a quantity relating to a crystal grown from a melt;
- first control means for performing one PID control action in response to a difference between a second detected value of a quantity relating to a diameter of said crystal and a desired value of said second detected value;
- second control means for outputting a value proportional to double time-integral of said difference in response to said difference;
- superposition means for outputting a value of representing a linear combination of the output of said setting means, the output of said first control means and the output of said second control means;
- final control means for controlling, in response to the output from said superposition means, speed of movement of said crystal moved axially relative to said heating device so as to limit said difference towards zero.

17. A diameter controller for crystallization according to claim 16, wherein said second control means comprises two integrators connected in series.

18. A diameter controller for crystallization based on the FZ method according to claim 16, wherein said second detected value relating to said diameter is a diameter of said melt at a position within 5 mm from said crystallization boundary.

19. A diameter controller for crystallization based on the CZ method according to claim 16, wherein said second detected value relating to said diameter is a diameter of said crystal at said crystallization boundary.

20. A diameter controller for crystallization based on the FZ method according to claim 16, wherein said first detected value relating to said crystal is a length of said crystal.

21. A diameter controller for crystallization based on the FZ or CZ method, comprising:
- setting means to output a predetermined value in response to a first detected value of a quantity relating to a crystal grown from a melt;
- first control means for performing PID control action in response to a difference between a second detected value of a quantity relating to a diameter of said crystal and a desired value of said second detected value;
- second control means for outputting a value proportional to double time-integral of said difference in response to said difference;
- superposition means for outputting a value of representing a linear combination of the output of said setting means, the output of said first control means and the output of said second control means;
- final control means for controlling, in response to the output from said superposition means, power supplied to a heating device for melting a raw material so as to limit said difference towards zero.

22. A diameter controller for crystallization according to claim 21, wherein said second control means comprises two integrators connected in series.

23. A diameter controller for crystallization based on the FZ method according to claim 21, wherein said second detected value relating to said diameter is a diameter of said melt at a position within 5 mm from said crystallization boundary.

24. A diameter controller for crystallization based on the CZ method according to claim 21, wherein said second detected value relating to aid diameter is a diameter of said crystal at said crystallization boundary.

25. A diameter controller for crystallization based on the FZ method according to claim 21, wherein said first detected value relating to said crystal is a length of said crystal.

26. A diameter controller for crystallization based on the FZ or CZ method, comprising:
- setting means to output a predetermined value in response to a first detected value of a quantity relating to a crystal grown from a melt;
- first control means for performing PID control action in response to a difference between a second detected value of a quantity relating to a diameter of said crystal and a desired value of said second detected value;
- second control means for outputting a value proportional to double time-integral of said difference in response to said difference;
- superposition means for outputting a value of representing a linear combination of the output of said setting means, the output of said first control means and the output of said second control means;
- final control means for controlling, in response to the output from said superposition means, power supplied to a heating device for melting a raw material and speed of movement said crystal moved axially relative to said heating device so as to limit said difference towards zero.

27. A diameter controller for crystallization according to claim 26, wherein said second control means comprises two integrators connected in series.

28. A diameter controller for crystallization based on the FZ method according to claim 26, wherein said second detected value relating to said diameter is a diameter of said melt at a position within 5 mm from said crystallization boundary.

29. A diameter controller for crystallization based on the CZ method according to claim 26, wherein said second detected value relating to said diameter is a diameter of said crystal at said crystallization boundary.

30. A diameter controller for crystallization based on the FZ method according to claim 26, wherein said first detected value relating to said crystal is a length of said crystal.

* * * * *